United States Patent [19]

Gupta et al.

[11] Patent Number: 4,490,192

[45] Date of Patent: Dec. 25, 1984

[54] STABLE SUSPENSIONS OF BORON, PHOSPHORUS, ANTIMONY AND ARSENIC DOPANTS

[75] Inventors: Arunava Gupta, Madison; Gary A. West, Dover; Jeffrey P. Donlan, Basking Ridge, all of N.J.

[73] Assignee: Allied Corporation, Morris Township, Morris County, N.J.

[21] Appl. No.: 502,360

[22] Filed: Jun. 8, 1983

[51] Int. Cl.$^3$ .......................................... H01L 21/225
[52] U.S. Cl. ................................... 148/188; 252/182; 252/950; 252/951; 423/290; 423/302; 423/344; 427/85; 427/240
[58] Field of Search .................. 148/188; 427/85, 240; 252/950, 951, 182; 423/344, 290, 302

[56] References Cited

U.S. PATENT DOCUMENTS

| | | | |
|---|---|---|---|
| 2,794,846 | 6/1957 | Fuller | 148/188 X |
| 3,041,214 | 6/1962 | Goetzberger | 148/188 X |
| 3,084,079 | 6/1963 | Harrington | 148/1.5 |
| 3,514,348 | 5/1970 | Han Ying Ku | 148/188 |
| 3,630,793 | 12/1971 | Christensen et al. | 148/188 |
| 3,658,584 | 4/1972 | Schmidt | 148/188 X |
| 3,660,156 | 5/1972 | Schmidt | 117/201 |
| 3,789,023 | 1/1974 | Ritchie | 252/182 X |
| 3,914,138 | 10/1975 | Rai-Choudhury | 148/188 X |
| 3,915,766 | 10/1975 | Pollack et al. | 148/188 |
| 3,971,870 | 7/1976 | Christensen et al. | 428/336 |
| 4,152,286 | 5/1979 | Crosson et al. | 252/950 X |

OTHER PUBLICATIONS

D. Rupprecht et al. (J. Electrochems. Soc. 1973, vol. 120, pp. 1266-1271) "Oxidized Boron Nitride Wafers as an In-Situ Boron Dopant for Silicon Diffusions".
A. M. Litman et al. (Soc. Plast. Eng., Tech. Pap., 1976 vol. 22 pp. 549-551) "Rheological Properties of Highly Filled Polyolefin/Ceramic Systems Suited for Injection Molding".
Haggerty et al. (Laser-Induced Chemical Processes Plenum Press, New York, 1981 pp. 165-241) "Sinterable Powders from Laser-Driven Reactions".

*Primary Examiner*—William G. Saba
*Attorney, Agent, or Firm*—Gus T. Hampilos; Alan M. Doernberg; Gerhard H. Fuchs

[57] ABSTRACT

Semiconductor doping compositions comprising a suspension of (a) a dopant material, in the form of finely divided spherical particles of narrow size distribution from about 0.1 D to D, where D is the diameter of the largest particle and is no more than about (1$\mu$) comprising a member selected from the group consisting of $B_xSi_y$, $B_xN_y$, $P_xSi_y$, $P_xN_y$, $As_xSi_y$ and $Sb_xSi_y$ wherein x and y vary from about 0.001 to about 99.999 mole percent, (b) an effective amount of a thermally degradable polymeric organic binder such as polymethyl methacrylate; and (c) an amount of an organic solvent, such a cyclohexanone, sufficient to dissolve said polymeric organic binder, such as polymethylmethacrylate, and to disperse said dopant material are disclosed. Three diffusion processes using the semiconductor doping compositions of the present invention for preparation of semiconductor materials having a wide range of sheet resistances and junction depths are also disclosed. The dopant materials selected for the semiconductor compositions of the present invention are less sensitive to moisture and chemical degradation and thereby afford greater processing latitude, are more reproducible and are less prone to create damage to and/or staining of the semiconductor substrate.

16 Claims, No Drawings

STABLE SUSPENSIONS OF BORON, PHOSPHORUS, ANTIMONY AND ARSENIC DOPANTS

BACKGROUND OF THE INVENTION

The present invention relates to semiconductor doping compositions and more particularly to semiconductor doping compositions that may be spun onto a semiconductor substrate and used in integrated circuit manufacture. The semiconductor doping composition comprises a suspension of (a) a dopant material, in the form of finely divided spherical particles of narrow size distribution from about 0.1D to D, where D is the diameter of the largest particle and is no more than about $1\mu$ comprising a member selected from the group consisting of $B_xSi_y$, $B_xN_y$, $P_xSi_y$, $P_xN_y$, $As_xSi_y$ and $Sb_xSi_y$ wherein x and y vary from about 0.001 to about 99.999 mole percent, (b) an effective amount of a thermally degradable polymeric organic binder such as polymethyl methacrylate; and (c) an amount of an organic solvent, such a cyclohexanone, sufficient to dissolve said polymeric organic binder and to disperse said dopant material Methods are known for making junction-type semiconductor devices (transistors, diodes, etc.) that involve the introduction, into a semiconductor substrate or suitable wafer material such as silicon, germanium, gallium arsenide, gallium phosphide, indium antimonide, or silicon-germanium alloy, of a controlled, small quantity of a dopant. For silicon, there are known N-type dopants, such as phosphorus, arsenic, and antimony; and there are known P-type dopants, such as boron, indium, aluminum, and gallium.

Since the junction depth of the dopant and the surface dopant concentration must be uniform to produce high yields of junction-type semiconductor devices having uniformly high service characteristics, a number of dopant compositions and processes to diffuse the dopants into the semiconductor materials are known. For example, D. Rupprecht et al. (J. Electrochems. Soc. 1973, Vol. 120 1266–1271) disclose that boron nitride wafers are oxidized in a diffusion furnace to $B_2O_3$ or $HBO_2$, and the oxide is transferred in the vapor phase to the silicon wafer surface or boric oxide wafers can be used directly. However, boron oxide and related sources are usually sensitive to moisture, create damaged or stained silicon surfaces, and/or involve costly and complicated processes to achieve quality doping. In addition, these dopant materials, as prepared by prior art methods, usually contained metal ion impurities, Na, Fe or Co which interfered with the operation of semiconductor devices manufactured with these impure dopant materials.

The prior art also discloses doping by means of liquid doping compositions which include a variety of organic and inorganic slurries, mixtures and solutions of doped oxide or a solution of ingredients which produces a doped oxide film. The various liquid doping compositions are painted, sprayed, spun on or centrifuged onto the semiconductor substrate. Among the liquid doping compositions disclosed in the prior art for fabrication of semiconductor devices are:

(1) U.S. Pat. No. 2,794,846 (Fuller) which discloses use of a glass-like slurry containing mixtures of pulverized particles with an active impurity such as aluminum oxide, with a heat-depolymerizable binder in a solvent;

(2) U.S. Pat. No. 3,084,079 (Harrington) which discloses use of liquid heat-depolymerizable polymers containing a homogeneous mixture of trimethoxyboroxine and methyltrimethoxysilane;

(3) U.S. Pat. No. 3,514,348 (Ku) which discloses use of a liquid dispersion containing colloidal silica particles suspended in water and aqueous solution of a semiconductor dopant such as $HBO_3$; and (4) U.S. Pat. Nos. 3,658,584 and 3,660,156 (Schmidt) disclose use of colloidal dispersions of a solid copolymer of hydrated silica and a hydrated oxide of a dopant element homogeneously dispersed in an aqueous polar or anhydrous polar solvent, respectively.

The use of the above-described liquid doping composition has introduced additional problems. For example, many of these liquids are incapable of producing thin films or thin films free of pin holes through which contaminants penetrate to degrade surface properties of the semiconductor. Even colloidal silica particles coated with an oxide of a dopant element or glass-like slurry containing mixtures of pulverized particles with aluminum oxide are inadequate to produce continuous doping films which are smooth, uniform and free of pin holes. Other disadvantages of these prior art liquid doping compositions include a non-homogeneous distribution of the dopant agent or the reactivity of components thereof, e.g., alkali metals, free water, carbonaceous decomposition products with the semiconductor substrate, resulting in problems such as nonadherence of the doping film, surface degradation, imperfections, irregular diffusion profiles, low yields, and degradation of electrical properties. A particularly troublesome characteristic of these liquid doping compositions is the tendency to settle, gel, solidify rapidly or degrade, resulting in a short shelf life and requiring use within a few hours or a few days after preparation. Thus, commercial use of these liquid doping compositions has been impeded by practical difficulties in formulating a suspension or solution which is sufficiently stable, sufficiently pure, and which can be formulated with sufficient reproducibility from batch to batch.

The prior art also discloses production of junction-type semiconductor devices by applying to a semiconductor substrate, e.g., a wafer, a prefabricated film that serves as a source of dopant. Thus, U.S. Pat. Nos. 3,630,793 and 3,971,870 (Christensen et al.) disclose preparation of a prefabricated film consisting of finely divided dopant such as phosphorus pentoxide or boron nitride homogeneously admixed with a volatile organic binder such as cyanoethylated cellulose. However, if the film applied to the wafer is fired in stacks, as required in any commercial operation, adhesion-preventing agents such as alumina must be included in the mixture or interspersed between the wafers comprising the stacks before the firing operation.

Prefabricated films are also disclosed in U.S. Pat. Nos. 3,915,766 and 3,914,138.

A. M. Litman et al. (Soc. Plast. Eng., Tech. Pap., 1976 Vol. 22, pages 549–551) disclose that 50–70 volume percent of mixtures of ceramic powders, e.g., 85 weight percent silicon nitride, plus 15 weight percent ceria in 30–50 volume percent of polyolefin resin binders are injected molded at an elevated temperature and pressure.

SUMMARY OF THE INVENTION

The present invention provides a semiconductor doping composition comprising a suspension of (a) a dopant material, in the form of finely divided, spherical particles of narrow size distribution from about 0.1D to D, where D is the diameter of the largest particle and is no more than about $1\mu$, comprising at least one member selected from the group consisting of $B_xSi_y$, $B_xN_y$, $P_xSi_y$, $P_xN_y$, $As_xSi_y$ and $Sb_xSi_y$ wherein x varies from about 0.001 to about 99.999 mole percent and wherein y simultaneously varies from about 99.999 to about 0.001 mole percent;

(b) an effective amount of a thermally degradable polymeric organic binder; and (c) an amount of an organic solvent sufficient to dissolve said polymeric organic binder and to disperse said dopant material.

DETAILED DESCRIPTION OF THE INVENTION

The present invention provides semiconductor doping compositions in the form of a suspension that offer significant advantages over the prior art. In the broadest aspect of the present invention, the dopant materials comprise one member selected from the group consisting of $B_xSi_y$, $B_xN_y$, $P_xSi_y$, $P_xN_y$, $As_xSi_y$ and $Sb_xSi_y$ wherein x may be varied continuously from about 0.001 mole percent to about 99.999 mole percent while y may be simultaneously varied from about 99.999 mole percent to 0.001 mole percent and thereby afford continuous adjustment of the doping levels of boron, phosphorus, antimony or arsenic in the semiconductor substrate over a wide range. The dopant materials selected for the semiconductor doping compositions are preferably powders containing doping elements boron, phosphorus, arsenic or antimony deposited on the semiconductor substrates e.g., silicon wafers, in combination with nitrogen or silicon, rather than oxygen, are less sensitive to moisture and chemical degradation and thereby afford greater processing latitude, are more reproducible, and are less prone to create damage to and/or staining of the semiconductor substrate. Further, the dopant materials comprising the semiconductor doping compositions of the present invention are in the form of finely divided spherical particles, preferably finely divided spherical particles having a diameter no more than about 1 micrometer and more preferably finely divided spherical particles having a narrow range of diameters in the order of about 10 to 100 nm and as such form (after removal of the solvent and thermal degradation of the polymeric organic binder) on the surface of the semiconductor substrate uniform thin films substantially free of pin holes through which contaminants may penetrate.

In a more preferred embodiment of the present invention, the semiconductor doping composition comprises a colloidal suspension of (a) dopant materials which are powders of boron and phosphorus, in combination with nitrogen or silicon, or of arsenic and antimony, in combination with silicon, in the form of finely divided spherical particles having diameters in the range of about 10 to 100 nm;

(b) thermally-degradable polymeric organic binders especially polymethylmethacrylate, and (c) an organic solvent, especially cyclohexanone. The more preferred doping compositions comprising colloidal suspensions of dopant materials such as $B_xSi_y$ in the form of finely divided spherical powders having diameters in the range of about 10 to 100 nm in a 10 weight percent solution of polymethylmethacrylate in cyclohexanone provided a uniformly thin layer of dopant material on the semiconductor substrate. The particles of the more preferred dopant materials having diameters in the range of about 10-100 nm, normally about 10-20 nm, stable colloidal suspension, and provided a uniformly thin layer of dopant material on a semiconductor substrate having an area as small as 1 square micrometer. The more preferred doping compositions prepared in accordance with the laser pyrolysis method described below are less prone to chemical degradation and thus have a shelf life much longer than previously available. See Example 10.

The present invention also includes three diffusion processes (including thermal degradation of the polymeric organic binders) using the semiconductor doping compositions of the present invention to provide semiconductor materials having a wide range of sheet resistances (0.2–1100 $\Omega/\square$) and junction depths (1–60 microns).

Other dopant materials useful for the present invention are powders such as boron nitride, or phosphorus nitride having diameters of no more than about 1 micrometer, commercially available from CERAC.

The preferred dopant materials for the doping compositions of the present invention are materials produced by a laser pyrolysis method similar to that described in "Sinterable Powders From Laser-Driven Reactions" by J. S. Haggerty et al. in *Laser-Induced Chemical Processes* (Plenum Press, New York, 1981) at pages 165–241. The following equations illustrate the reactions useful for preparation of these materials:

| | | |
|---|---|---|
| $xB_2H_6 + ySiH_4$ | $\rightarrow$ | $B_xSi_y + nH_2$ |
| $xB_2H_6 + yNH_3$ | $\rightarrow$ | $B_xN_y + nH_2$ |
| $xPH_3 + ySiH_4$ | $\rightarrow$ | $P_xSi_y + nH_2$ |
| $xPH_3 + yNH_3$ | $\rightarrow$ | $P_xN_y + nH_2$ |
| $xAsH_3 + ySiH_4$ | $\rightarrow$ | $As_xSi_y + nH_2$ |
| $xSbH_3 + ySiH_4$ | $\rightarrow$ | $Sb_xSi_y + nH_2$ |

The composition of the above-listed non-stoichiometric products, such as $Bi_xSi_y$, are readily varied over the wide range of values for x from about 0.001 mole percent to about 99.999 mole percent by varying the relative amounts (e.g. by varying the relative flow rates) of each gaseous reactant fed to the laser pyrolysis zone, in the presence of argon buffer gas. The powders prepared by the laser pyrolysis method have the following characteristics:

(1) spherical shape, (2) narrow range of diameters on the order of 10 nm to 100 nm, (3) highly controlled purity, i.e., total impurity content which is almost exclusively oxygen of less than 1% by weight, usually less than about 300 ppm, and (4) freedom from agglomeration.

The particle size may be varied over the whole range of 10 nm to 1000 nm by adjusting the process parameters, especially the partial pressures or flow rates of each gaseous reactant, as well as the total reaction zone pressure.

Among the thermally degradable polymeric organic binders found useful in the doping compositions of the present invention are poly($C_1$–$C_6$ alkyl)methacrylates, wherein $C_1$–$C_6$ alkyl includes methyl, ethyl, n-propyl, i-propyl, i-butyl, sec-butyl, n-amyl, i-amyl, 1,2-dimethylpropyl, neopentyl, n-hexyl, 3,3-dimethylbutyl and 1,3-dimethylbutyl; polydichloroacetaldehyde; polystyrene, d-methyl polystyrene; low molecular weight polyethylene, such as A-C® polyethylene resins commercially available from Allied Chemical Co.; polypropylene, especially low molecular weight polypropylene; and cellulose-based polymers, especially lower alkyl cellulose ethers, including methyl-, ethyl-, and n-propyl, hydroxy-ethyl, hydroxy-propyl cellulose ether. Poly($C_1$-$C_6$ alkyl)methacrylates are preferred. Polymethylmethacrylate is an especially preferred poly($C_1$-$C_6$ alkyl)-methacrylate.

It is important that the organic polymer provides a stable colloidal suspension with the dopant materials of the present invention as well as be substantially, i.e., >99% thermally-degradable at temperatures in the range of about 300°-800° C., preferably 300°-400° C., to leave a uniform coating of the finely divided dopant materials on the surface of the semiconductor substrate. For example, in the preferred embodiments of the present invention, doping composition of poly($C_1$-$C_6$alkyl)-methacrylates cleanly degrade to the corresponding volatile monomers at temperatures below about 250° C. to leave a uniform coating of dopant powder on the silicon wafer suitable for diffusion. Polymers which do not substantially completely thermally degrade or which leave decomposition products which interfere with diffusion of the dopant film into the semiconductor substrate are to be avoided.

Among the organic solvents found useful in the doping compositions of the present invention are those solvents which completely dissolve the thermally-degradable polymeric organic binders and disperse the dopant materials so as to form a colloidal suspension. Suitable organic solvents include liquid hydrocarbons and mixtures thereof; $C_1$-$C_4$ alkanols; such as methanol, ethanol and isopropanol and aqueous mixtures thereof; di($C_1$-$C_4$ alkyl)alkanamides such as DMF, ($C_5$-$C_6$)cycloalkanones, e.g. cyclohexanone; di($C_2$-$C_4$ alkyl)ethers, e.g. diethylether; cyclic ethers, e.g., THF; and chloronated ($C_1$-$C_4$) alkanes, especially chloromethanes, e.g., dichloromethane, chloroform and carbon tetrachloride; and chlorinated aromatics such as ortho-dichlorobenzene. Other suitable organic solvents suggested to those skilled in the art in view of this disclosure are considered within the scope of the present invention.

Organic solvents with high dielectric constants are preferred. Exemplary organic solvents especially useful for the doping composition containing the polymeric organic binders described hereinabove are given in Table A below:

TABLE A

| Polymeric Organic Binders | Exemplary Organic Solvents |
| --- | --- |
| low molecular weight polyethylene | Soluble in aromatic hydrocarbons, e.g., xylenes, benzene and toluene at temperatures near their boiling points |
| low molecular weight polypropylene | chlorinated aliphatic and aromatic hydrocarbons, e.g. trichloroethylene and o-dichlorobenzene |
| polystyrene | cyclohexane/acetone methyl ethyl ketone (MEK) cyclohexanone, ethyl acetate, THF |
| polydichloroacetaldehyde | THF |
| poly($C_1$-$C_6$ alkyl)-methacrylates | dichloromethane, chloroform, chlorobenzene, MEK, |

TABLE A-continued

| Polymeric Organic Binders | Exemplary Organic Solvents |
| --- | --- |
| | ethanol/water, ethanol/carbon tetrachloride cyclohexanone, isopropanol; Cyclohexanone is the preferred solvent for poly($C_1$-$C_6$)-methacrylates. |

GENERAL EXPERIMENTAL

Example 1

Preparation of Dopant Materials

The dopant materials were prepared in an apparatus and by a method similar to that described in "Sinterable Powders from Laser-Driven Reactions" at pages 165-241 by J. Haggerty et al. in *Laser-Induced Chemical Processes* (Plenum Press, N.Y. 1981). A flowing mixture of reactant gases, in the presence of argon gas, as an inert carrier gas, was pyrolyzed with a continuous wave 50 watt $CO_2$ laser focused down to a 2 mm spot using a 25.4 cm focal length NaCl lense. The flow rates of all gaseous reactants were independently adjusted by using a flow meter. A reaction flame usually accompanied the formation of particles which were carried to a filter by argon carrier gas. A typical run lasted 2-3 hours and resulted in formation of 2-3 grams of very fine, nearly spherical particles, having a narrow size distribution. Should one of the reactants be liquid at STP, a mixture of the vapor in argon carrier gas may be conveniently prepared by using a bubbler.

Example 2

Preparation of Semiconductor Dopant Composition

Typically, a homogeneous mixture of dopant material in 10% (w/w) solution of polymethylmethacrylate (PMMA) in cyclohexanone was prepared by placing components in a ball mill or sonicator for a time sufficient to disperse the ultrafine particles of the dopant material and to form a homogeneous mixture. Examples 5 and 7 describe the preferred proportions used for boron-nitrogen and boron-silicon powders, respectively. The proportions of dopant material to polymeric binder solution are not critical and may be varied over a wide range, e.g. 1:1 to 1:10 to suit need.

Example 3

Spin-on Process

The semiconductor substrate, typically an N-type silicon wafer was held by vacuum on the chuck of a standard substrate spinner (available from Headway Research Corp.) equipped with a continuously variable speed control (2000-10,000 rpm) and a timer. In a typical application the semiconductor dopant composition, prepared as described in Example 2, was removed via syringe from a bottle sealed with a rubber septum and applied to a motionless silcon wafer until the surface thereof was nearly completely coated. The wafer was typically spun at 3,000 rpm for 60 seconds. The whole procedure was repeated twice to produce a film of three successive layers, which completely and reproducibly covered the face of the wafer surface. The coated wafer was placed in an oven at 95° C. to remove the solvent (cyclohexanone) and to leave a hard PMMA/dopant film having a thickness in the range of 10-2000 nm (measured with a Tencor Instrument Alpha-Step tracer).

Example 4

General Experimental for Diffusion Process Including Thermal Degradation of Polymeric Organic Binders While all the diffusion experiments were done with semiconductor dopant compositions containing only PMMA, it will be understood by those skilled in the art that thermal degradation and diffusion times, temperatures, furnace ambients and exact processes may vary. Described below are three diffusion processes, two of which differ only in the order of oxidation and diffusion steps. In one process, the wafers coated with dopant/P-MMA films and heated until substantially free of organic solvent as described in Example 3, are placed in a quartz tube in a diffusion furnace, which is purged of air with argon. The temperature is raised to about 300°–800° C. (250°–350° C. for PMMA) over a 30–60 minute period to thermally degrade the polymer organic binder and to produce a uniform coating of finely divided spherical dopant particles on a face of the wafer. The temperature is then raised to 850° to 1350° C., in the presence hours, to produce the desired level of doping. The furnace ambient is changed to oxygen or wet oxygen and the temperature is changed to 900°–1200° C. for oxidation times up to 2 hrs. After the oxidation step, the wafer is cooled and oxidized dopant material remaining on the face of the wafer is removed by brushing or by deglazing with buffered aqueous HF solution. In the second process, the oxidation step precedes the diffusion step; in all other aspects, the second process is similar to the first. In a third diffusion process, suitable for $B_xN_y$ and $P_xN_y$, the oxidation step is not performed; in all other aspects, the third process is similar to the first (see Example 5). By using these three diffusion processes with the semiconductor doping compositions of the present invention, semiconductor materials having sheet resistances of from 0.2 to 1100 $\Omega/\square$ and junction depths of about 1 to 60 microns are prepared.

Example 5

One part of boron nitride (BN 99.9% pure, average particle size 1 micron, Cerac) was added to two parts of a 10% (w/w) PMMA in cyclohexanone to produce a mixture which was ball-milled for 15 minutes. The resultant homogeneously mixed suspension was applied to a silicon wafer which was spun at 3,000 rpm for 60 seconds. The procedure was repeated to produce three layers and the wafer was prebaked at 100° C. to remove any remaining solvent. The wafer was placed in a diffusion furnace, purged with argon, at 250°–400° C. for 30 minutes to produce a uniform film of only BN powder on the wafer. The temperature was raised to 1140°–1250° C. in the presence of argon gas for 1–22 hrs. No oxidation step was performed. After diffusion the BN dopant powder remaining on the surface of the wafer was removed by brushing and/or blown away to leave a clean wafer surface. The results of three runs at different diffusion times and temperatures are provided in Table 1.

TABLE I

| | BN Diffusions Without Oxidation | | |
|---|---|---|---|
| Run # | Temperature (°C.) | Time (hr.) | $R_s$* $\Omega/\square$ |
| 1 | 1140 | 1 | 2.5 |
| 2 | 1250 | 1 | 1.7 |
| 3 | 1250 | 22 | 0.23 |

*Sheet Resistance.

This example illustrates that the diffusion depth, dopant concentration and sheet resistances are controlled by the diffusion time and temperature.

Example 6

Preparation of $Bi_xSi_y$ Powders

Boron-silicon powders containing 4.2, 18.3 and 39.3 mole % of B were prepared, in the form of finely divided spherical particles, in accordance with the procedure of Example 1 by reacting $B_2H_6$ at flow rates of 1.2, 2.9, and 0.54 sccm with $SiH_4$ at flow rates of 10, 10, and 24.8 sccm, respectively, in the presence of argon.

Example 7

Diffusion of $B_xSi_y$ Into Silicon

This example illustrates that the level of doping can be controlled by adjusting the percentage of boron incorporated into the $B_xSi_y$ dopant materials prepared in Example 6.

A 10% w/w solution of polymethylmethacrylate (molecular weight 33,000) in cyclohexanone was prepared. Three mixtures were then prepared, each containing 200 mg of a boron-silicon powder (which contained 4.2, 18.3 and 39.3 mole % boron), 6 mL of the 10% PMMA solution, and 1.6 mL of cyclohexanone. These mixtures were then mixed in a sonicator to disperse the ultrafine particles and form homogeneous mixtures.

Each mixture was then applied to an N-type silicon wafer to form a dopant source layer from which boron atoms will diffuse to form a P-type layer in the N-type silicon. A 2.54 cm diameter N-type silicon wafer, manufactured with a resistivity of approximately 10 $\Omega$-cm, was placed on a conventional substrate spinning apparatus. While the wafer was stationary, one of the mixtures was applied until the surface was almost completely covered. The wafer was then spun at 3,000 rpm for 60 seconds. The application was repeated for a total of three layers, giving film thicknesses on the order of 0.5 micrometers. While the practice of covering the wafer with the liquid mixture before spinning wasted the material, it assured reproducible and complete coverage in the absence of an automatic pipetting system.

The wafer was then placed in an oven at approximately 95° C. for at least 30 minutes to evaporate any remainig cyclohexanone. At this point, the wafer had a uniform layer of dopant powder bound in polymethylmethacrylate and was now ready for a standard diffusion process.

The wafer was placed in a quartz tube in a diffusion furnace and the tube then purged with a steady flow of argon. The furnace was then gradually heated so as to rise steadily through the temperature range 250°–400° C. and to assure the complete pyrolysis and evaporation of the polymethylmethacrylate. Once 400° C. was reached, the furnace was set to diffusion temperature (for this example 1260° C.). The diffusion temperature (1260°) was held for the desired length of time (1 hour), after which the temperature was reduced to 1000° C., the flowing gas was switched from argon to oxygen and the temperature was maintained for oxidation (2 hours). The furnace was then turned off and allowed to cool to ambient temperature. The wafers were coated with a blue oxide film which was removed in a buffered HF solution. The results for the three boron concentrations are summarized in Table II hereinbelow.

TABLE II

| | Diffusion Then Oxidation | | | | |
|---|---|---|---|---|---|
| | Diffusion Conditions | | Oxidation | $R_s$* | |
| Run # | Temp. (°C.), | (Time, hrs.) | Time (hrs.) | ($\Omega/\square$) | |
| | | | | % Mol B: 4.2 | 18.3 39.3 |
| 4 | 1150° | (1.17 hrs.) | 2 | 17.2 | 1.8 1.4 |
| 5 | 1250° | (1 hr.) | 2 | 12.6 | 0.8 0.56 |
| 6 | 1260° | (22 hrs.) | 2 | 3.0 | 0.3 1.4 |
| 7 | 1260° | (1 hr.) | 2 | 4.74 | 1.99 0.53 |
| 8 | 1260° | (22 hrs.) | 2 | 2.82 | 2.0 0.43 |

*Sheet Resistance

Example 8

Alternative Diffusion Procedure

The procedure of Example 7 was used except that the oxidation at 1000° C. with oxygen preceded the diffusion step at 1150° and 1250° C. in argon. The results are summarized in Table III.

TABLE III

| | | Oxidation Then Diffusion | | | |
|---|---|---|---|---|---|
| Run # | Oxidation Time* (hr.) | Diffusion Condition | | $R_s$** | |
| | | Temp. (°C.) | (Time, hr.) | ($\Omega/\square$) | |
| | | | | % Mol B: 4.2 | 18.3 39.3 |
| 9 | 0.20 | 1150° | (1 hr.) | 30 | 32 5.5 |
| 10 | .35 | 1250° | (1 hr.) | 6.1 | 3.8 2.1 |

Footnotes to Table III
*Oxidation in oxygen at 1000° C.
**Sheet Resistances for diffusion of B into N-Type silicon

Example 9

This example illustrates a particularly useful embodiment of the invention, wherein the doping composition is used to achieve low levels of doping in a single diffusion step, for example a P-type layer, having junction depths of 1-3 microns and sheet resistances of 20 to 1100 $\Omega/\square$.

A sample of boron-silicon powder containing 4.2 mole % boron prepared as described in Example 6 was diluted in various combinations with pure ultrafine silicon powder to achieve even lower concentrations of boron. This powder mixture was then used to make doping compositions which were applied and used as described in Example 7. The level of doping was controlled by temperature, diffusion time, and concentration of boron in the dopant source layer. The results are shown in Table IV hereinbelow.

TABLE IV

| | Low Level Doping Experiments With $B_xSi_y$ | | | | |
|---|---|---|---|---|---|
| | | Diffusion Conditions | | Oxidation Conditions | |
| Run # | Mole % B* | Temp. (°C.) | Time (hrs.) | Temp. (°C.) | Time (hrs.) | $R_s$** ($\Omega/\square$) |
| 11 | 4.2% | 1000° | 4 | 1000° | 2 | 20 |
| | | 900° | 4 | 900° | 2 | 100 |
| 12 | 0.42% | 1000° | 4 | 1000° | 2 | 1100 |
| 13 | | 1050° | 1 | 1000° | 2 | 272 |
| 14 | | 1050° | 1.25 | 1000° | 2 | 230 |
| 15 | | 1050° | 1.25 | 1000° | 1 | 183 |

TABLE IV-continued

| | Low Level Doping Experiments With $B_xSi_y$ | | | | |
|---|---|---|---|---|---|
| | | Diffusion Conditions | | Oxidation Conditions | |
| Run # | Mole % B* | Temp. (°C.) | Time (hrs.) | Temp. (°C.) | Time (hrs.) | $R_s$** ($\Omega/\square$) |
| 16 | | 1050° | 0.75 | 1000° | 1 | 89 |
| 17 | | 1050° | 1.75 | 1000° | 1 | 81 |
| 18 | 0.09% | 1050° | 1.25 | 1000° | 1 | 377 |
| 19 | 2.1% | 1050° | 1.25 | 1000° | 1 | 25.2 |

*Mole % < 4.2 mole % B were obtained by mixing $Bi_xSi_y$ containing 4.2 mole % B with ultrafine silicon powder.
**Sheet resistances of Type-P silicon.

Example 10

Shelf Life Experiment of Ultrafine $B_xSi_y$ Powders in PMMA/cyclohexanone

This example demonstrates the stability of the dopant source by comparing the diffusion results from a new and an old dopant mixture. A fresh dopant mixture using the 4.2 mole % boron powder prepared as described in Example 6 in 10% (w/w) PMMA in cyclohexanone was made as described in Example 7. Two wafers were then prepared as described in Example 7, one using the fresh mixture and one using a mixture that was stored for two months.

The wafers were then diffused for four hours at 1000° C. and then oxidized for two hours at 1000° C. The oxide film was then removed in buffered HF solution and sheet resistance measurements made with a standard fourpoint probe.

The sheet resistance of the wafer prepared with 2 month old mixture was 26.35 $\Omega/\square$; the sheet resistance of the wafer prepared with the fresh mixture was 19.83 $\Omega/\square$.

We claim:

1. A semiconductor doping composition comprising a colloidal suspension of
   (a) a dopant material, in the form of finely divided, spherical particles of narrow size distributions from about 0.1D to D where D is the diameter of the largest particle and is no more than about 1 micrometer, comprising a member selected from the group consisting of $B_xSi_y$, $B_xN_y$, $P_xSi_y$, $P_xN_y$, $As_xSi_y$ and $Sb_xSi_y$ wherein x varies from about 0.001 to about 99.999 mole percent and wherein y simultaneously varies from about 99.999 to about 0.001 mole percent;
(b) an effective amount of a thermally degradable polymeric organic binder; and
(c) an amount of an organic solvent sufficient to dissolve said polymeric organic binder and to disperse said dopant material.

2. The semiconductor doping composition of claim 1 wherein said polymeric organic binder is selected from the group consisting of poly($C_1$–$C_6$ alkyl)methacrylate, polydichloroacetaldehyde, polystyrene, low molecular weight polyethylene, low molecular weight polypropylene, and cellulose-based polymers.

3. The semiconductor doping composition of claim 1, wherein from about 50 to about 90 mole percent of said dopant material and about 10 to about 50 mole percent of said polymeric organic binder are present.

4. The semiconductor doping composition of claim 3 wherein said polymeric organic binder is polymethylmethacrylate.

5. The semiconductor doping composition of claim 4 wherein the diameter of the particles of said dopant material is in the range of about 10 to 20 nm.

6. The semiconductor doping composition of claim 5 said dopant material is $B_xSi_y$.

7. The semiconductor doping composition of claim 5 wherein said dopant material is $B_xN_y$.

8. A method of doing semiconductor material comprising, in sequence, the steps of:
(a) depositing on a face of a semiconductor substrate the composition of claim 7 in an amount sufficient to produce a uniform deposit on the order of about 10 to 2000 nm in thickness on the face of the semiconductor substrate;
(b) spinning the semiconductor substrate;
(c) heating said deposit at a temperature sufficient to remove substantially all the organic solvent in the composition from said deposit;
(d) placing the semiconductor substrate in a diffusion furnace, in the presence of a gaseous stream comprising argon or oxygen at a temperature in the range of about 300°–800° C. for a time sufficient to degrade substantially all said polymeric organic binder in said deposit and to produce a uniform coating of finely divided spherical dopant particles on the face of the semiconductor substrate;
(e) heating the semiconductor substrate in the presence of a stream comprising argon or nitrogen at a temperature in the range of about 850° to 1350° C. for a time sufficient to produce the required level of doping; and
(f) treating the face of the semiconductor substrate for a time sufficient to remove any oxidized dopant material present on the face of the semiconductor substrate.

9. The method of claim 8 wherein said polymeric organic binder is selected from the group consisting of poly($C_1$–$C_6$ alkyl)methacrylate, polydichloroacetaldehyde, polystyrene, low molecular weight polyethylene, polypropylene, and cellulose-based polymers.

10. The method of claim 8 wherein the dopant material comprises a member selected from the group $B_xSi_y$, $P_xSi_y$, $As_xSi_y$ and $Sb_xSi_y$ and further comprising the step of replacing the gaseous stream comprising argon or nitrogen with a gaseous stream comprising oxygen or wet oxygen while maintaining a temperature in the range of about 900°–1200° C. for a time sufficient to oxidize the finely divided spherical silicon-containing dopant particles remaining on the face of the semiconductor substrate; and wherein the treating step comprises treating the substrate with a buffered HF solution.

11. The semiconductor doping composition of claim 1 wherein the dopant material comprises a member selected from the group consisting of $B_xSi_y$, $P_xSi_y$, $As_xSi_y$ and $Sb_xSi_y$.

12. A method of doping semiconductor material comprising, in sequence, the steps of:
(a) depositing on a face of a semiconductor substrate the composition of claim 19 in an amount sufficient to produce a uniform deposite on the order of about 10 to about 700 nm in thickness on the face of the semiconductor material;
(b) spinning the semiconductor substrate;
(c) heating said deposit at a temperature sufficient to remove substantially all the organic solvent in the composition from said deposit;
(d) placing the semiconductor substrate in a diffusion furnace, in the presence of a gaseous stream comprising argon or oxygen at a temperature in the range of about 300°–800° C. for a time sufficient to degrade substantially all said polymeric organic binder in said deposit and to produce a uniform coating of finely divided spherical dopant particles on the face of the semiconductor substrate;
(e) heating the semiconductor substrate in the presence of a gaseous stream comprising oxygen or wet oxygen at a temperature in the range of about 700°–1000° C. for a time sufficient to oxidize said uniform coating;
(f) replacing the gaseous stream comprising oxygen or wet oxygen with a gaseous stream comprising nitrogen or argon while raising the temperature from about 1000° C. to about 1350° C. and maintaining same for a time sufficient to produce the required level of doping; and
(g) treating the face of the semiconductor substrate with a buffered HF solution for a time sufficient to remove substantially all oxidized dopant material remaining on the face of the semiconductor substrate.

13. The process of claim 12 wherein x in the dopant material of the composition of claim 11 varies from about 0.1 mole % to about 40.0 mole %.

14. The process of claim 12 wherein the composition of claim 11 comprises a colloidal suspension of $B_xSi_y$ in polymethylmethacrylate dissolved in cyclohexanone.

15. The process of claim 12 wherein the particles of the dopant material have a diameter of no more than about 10–20 nm.

16. The semiconductor doping composition of claim 1 wherein said dopant material contains less than about 1% by weight oxygen.

* * * * *

UNITED STATES PATENT AND TRADEMARK OFFICE
CERTIFICATE OF CORRECTION

PATENT NO. : 4,490,192

DATED : December 25, 1984

INVENTOR(S) : A. Gupta, G. A. West, J. P. Donlan

It is certified that error appears in the above-identified patent and that said Letters Patent are hereby corrected as shown below:

Claim 12, line 18, "claim 19" should read --claim 12--

Claim 12, line 19, "deposite" should read --deposit--

Signed and Sealed this

Twenty-eighth Day of May 1985

[SEAL]

Attest:

DONALD J. QUIGG

Attesting Officer     Acting Commissioner of Patents and Trademarks